US011333616B2

(12) United States Patent
Laredo (10) Patent No.: US 11,333,616 B2
(45) Date of Patent: May 17, 2022

(54) ADAPTIVE FOCUSING SYSTEM FOR A SCANNING METROLOGY TOOL

(71) Applicant: KLA CORPORATION, Milpitas, CA (US)

(72) Inventor: Gilad Laredo, Haifa (IL)

( * ) Notice: Subject to any disclaimer, the term of this patent is extended or adjusted under 35 U.S.C. 154(b) by 12 days.

(21) Appl. No.: 17/053,746

(22) PCT Filed: Oct. 8, 2020

(86) PCT No.: PCT/US2020/054660
§ 371 (c)(1),
(2) Date: Nov. 6, 2020

(65) Prior Publication Data
US 2022/0034820 A1 Feb. 3, 2022

Related U.S. Application Data

(60) Provisional application No. 63/058,523, filed on Jul. 30, 2020.

(51) Int. Cl.
*G01N 21/88* (2006.01)
*G01B 11/06* (2006.01)
*G01N 21/95* (2006.01)

(52) U.S. Cl.
CPC ..... *G01N 21/8806* (2013.01); *G01B 11/0608* (2013.01); *G01N 21/9501* (2013.01); *G01B 2210/56* (2013.01)

(58) Field of Classification Search
CPC .. G03F 7/70625; G03F 7/705; G03F 7/70616; G03F 9/7049; H01L 22/12;
(Continued)

(56) References Cited

U.S. PATENT DOCUMENTS 9,927,722 B2 3/2018 Van Berkel et al.
10,663,281 B2 5/2020 Manassen et al.
(Continued)

FOREIGN PATENT DOCUMENTS

JP 2001304812 A 10/2001
KR 20130036331 A 4/2013
WO 2020197544 A1 10/2020

OTHER PUBLICATIONS

WIPO, ISR for PCT/US2020/054660, dated Apr. 19, 2021.

*Primary Examiner* — Shawn Decenzo
*Assistant Examiner* — Jarreas C Underwood
(74) *Attorney, Agent, or Firm* — Hodgson Russ LLP (57) ABSTRACT

An adaptive focusing system including an optics module, an optics module height positioner (OMHP), a position sensor operative to generate a position output indicating a height of the optics module, a predictive height estimator operative to generate an estimated height value of a sample at each site of a plurality of sites, and generate a desired optics module height output for each of the sites, a regulator operative to generate, at least partially based on the desired optics module height output and a known height of the optics module, a sequence of optics module height control instructions for the plurality of sites, a driver operative to provide a sequence of control outputs to the OMHP and a model predictive controller (MPC) operative to monitor differences between a reported height of the optics module and an MPC-expected height of the optics module, thereby to generate system amelioration values.

24 Claims, 2 Drawing Sheets

(58) Field of Classification Search
CPC .. G01N 21/956; G01B 11/0608; G01B 11/02; G01B 11/14; G01B 11/06
See application file for complete search history.

(56) References Cited

U.S. PATENT DOCUMENTS

| | | | |
|---|---|---|---|
| 2002/0135775 A1* | 9/2002 | De Groot | G01B 11/30 356/497 |
| 2005/0134865 A1* | 6/2005 | Schoonewelle | G03F 9/7011 356/601 |
| 2006/0202103 A1* | 9/2006 | Weiss | G02B 7/282 250/201.2 |
| 2006/0221348 A1* | 10/2006 | Deck | G01B 11/2441 356/511 |
| 2012/0008137 A1 | 1/2012 | Young et al. | |
| 2014/0169657 A1* | 6/2014 | Harada | H01L 22/12 382/145 |
| 2018/0292198 A1 | 10/2018 | Manassen et al. | |
| 2019/0206654 A1* | 7/2019 | Takahashi | H01J 37/20 |
| 2020/0249576 A1* | 8/2020 | Warnaar | G03F 7/705 |
| 2020/0348603 A1* | 11/2020 | Staals | G03F 7/70616 |

\* cited by examiner

ADAPTIVE FOCUSING SYSTEM FOR A SCANNING METROLOGY TOOL

REFERENCE TO RELATED APPLICATIONS

Reference is hereby made to U.S. Provisional Patent Application Ser. No. 63/058,523, filed Jul. 30, 2020 and entitled FOCUS CONTROL METHOD FOR METROLOGY SCANNING PLATFORMS, the disclosure of which is hereby incorporated by reference and priority of which is hereby claimed.

Reference is also made to the following patents and patent applications of the Applicant, which are related to the subject matter of the present application, the disclosures of which are hereby incorporated by reference:

U.S. Pat. No. 10,663,281 entitled SYSTEMS AND METHODS FOR OPTIMIZING FOCUS FOR IMAGING-BASED OVERLAY METROLOGY; and PCT Application No. PCT/US2019/023918, filed Mar. 25, 2019 and entitled VACUUM HOLD-DOWN APPARATUS FOR FLATTENING BOWED SEMICONDUCTOR WAFERS.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved systems for measurement of misregistration, particularly in the manufacture of semiconductor devices.

There is thus provided in accordance with a preferred embodiment of the present invention an adaptive focusing system for a scanning metrology tool, the adaptive focusing system including an optics module including at least one optical component, an optics module height positioner (OMPH), a position sensor operative to generate a position output indicating a height of the optics module, a predictive height estimator (PHE) operative to generate an estimated height value of a sample at each site of a plurality of sites, the plurality of sites being located along a path defined by a movement of the optics module relative to the sample, and generate a desired optics module height output for each of the sites, the desired optics module height output being based at least partially on the estimated height value at the site, a regulator operative to generate, at least partially based on the desired optics module height output and a known height of the optics module, a sequence of optics module height control instructions for the plurality of sites, a driver operative to provide a sequence of control outputs to the OMHP, the sequence of control outputs being based on the sequence of optics module height control instructions, and a model predictive controller (MPC) operative to monitor differences between a reported height of the optics module, the reported height being at least partially based on the position output generated by the position sensor and an MPC-expected height of the optics module, the MPC-expected height of the optics module being at least partially based on the optics module height control instructions, thereby to generate system amelioration values.

In accordance with a preferred embodiment of the present invention, the adaptive focusing system also includes a filter operative to generate an ameliorated optics module height feedback value. Preferably, the ameliorated optics module height feedback value is a function of at least the position output of the position sensor and a filter-expected height of the optics module.

Preferably, the filter-expected height of the optics module is a function of at least one of the optics module height control instructions of the regulator and the control outputs of the driver.

In accordance with a preferred embodiment of the present invention, the reported height of the optics module includes the ameliorated optics module height feedback value generated by the filter. Preferably, the filter is operative to communicate the ameliorated optics module height feedback value feedback to at least one of the PHE, the regulator and the MPC.

In accordance with a preferred embodiment of the present invention, the system amelioration values include parameters of a set of equations, the set of equations describing a relationship between at least two of the optics module, the OMHP, the position sensor, the PHE, the regulator, the driver and the filter. Preferably, the MPC is operative to communicate the system amelioration values to at least one of the PHE, the regulator and the filter.

In accordance with a preferred embodiment of the present invention, the adaptive focusing system also includes an estimated height database (EHD), and the PHE is operative to access and modify the EHD. Preferably, the PHE updates the estimated height values during at least one of a measurement of the measurement site and a movement of the optics module relative to the sample.

Preferably, the estimated height value includes a surface height of a semiconductor device wafer at the site, and the PHE generates the estimated height value at least partially based on at least one of a chuck signature, an output from a patterned wafer geometry tool, at least one fabrication surface height output by a fabrication tool which fabricated at least a portion of the wafer and a reported height of at least one additional site intended to be identical to a height of the site.

In accordance with a preferred embodiment of the present invention, the additional site includes at least one site located on at least one of one or more previously measured scribe lines on the wafer, one or more previously measured fields on the wafer, one or more previously measured scribe lines on an additional wafer and one or more previously measured fields on an additional wafer.

Preferably, a value of the height of the at least one additional site is generated at least partially based on a measurement of the wafer prior to the formation of a current layer on the wafer.

In accordance with a preferred embodiment of the present invention, the PHE includes a linear estimation model. Preferably, the linear estimation model includes a minimum mean square estimation (MMSE) model.

Alternatively, in accordance with a preferred embodiment of the present invention, the PHE includes a non-linear estimation model. Preferably, the non-linear estimation model includes a neural network.

In accordance with a preferred embodiment of the present invention, the optics module height control instructions are further based on a required magnitude of the control outputs.

Preferably, the regulator includes one of a linear quadratic regulator (LQR) and a linear quadratic gaussian (LQG) regulator.

Preferably, the system amelioration values include at least one of a mass, a damping constant, a spring constant, a power coefficient, an electro-magnetic force, a resistivity, an inductance and a capacitance. In accordance with a preferred embodiment of the present invention, the MPC-expected height is at least partially based on the control outputs.

Preferably, a difference between an actual optics module height at a site and the desired optics module height output at the site is less than 25 nm. Preferably, the optics module has a first focused operative orientation at a first measurement site, the optics module has a second focused operative orientation at a second measurement site and the optics module is operative to move between the first focused operative orientation and the second focused operative orientation in a time of less than 2 milliseconds. Preferably, the OMHP draws an average power of less than 0.1 W and a maximum power of less than 2 W.

There is also provided in accordance with another preferred embodiment of the present invention a scanning metrology system including a scanning metrology tool including an adaptive focusing system, the adaptive focusing system including an optics module including at least one optical component, an optics module height positioner (OMHP), a position sensor operative to generate a position output indicating a height of the optics module, a predictive height estimator (PHE) operative to generate an estimated height value of a sample at each site of a plurality of sites, the plurality of sites being located along a path defined by a movement of the optics module relative to the sample and generate a desired optics module height output for each of the sites, the desired optics module height output being based at least partially on the estimated height value at the site, a regulator operative to generate, at least partially based on the desired optics module height output and a known height of the optics module, a sequence of optics module height control instructions for the plurality of sites, a driver operative to provide a sequence of control outputs to the OMHP, the sequence of control outputs being based on the sequence of optics module height control instructions, and a model predictive controller (MPG) operative to monitor differences between a reported height of the optics module, the reported height being at least partially based on the position output generated by the position sensor and an MPG-expected height of the optics module, the MPG-expected height of the optics module being at least partially based on the optics module height control instructions, thereby to generate system amelioration values.

In accordance with a preferred embodiment of the present invention, the scanning metrology tool includes one of a misregistration metrology tool, a critical dimension and shape metrology tool, a thin film metrology tool and a defect inspection metrology tool.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
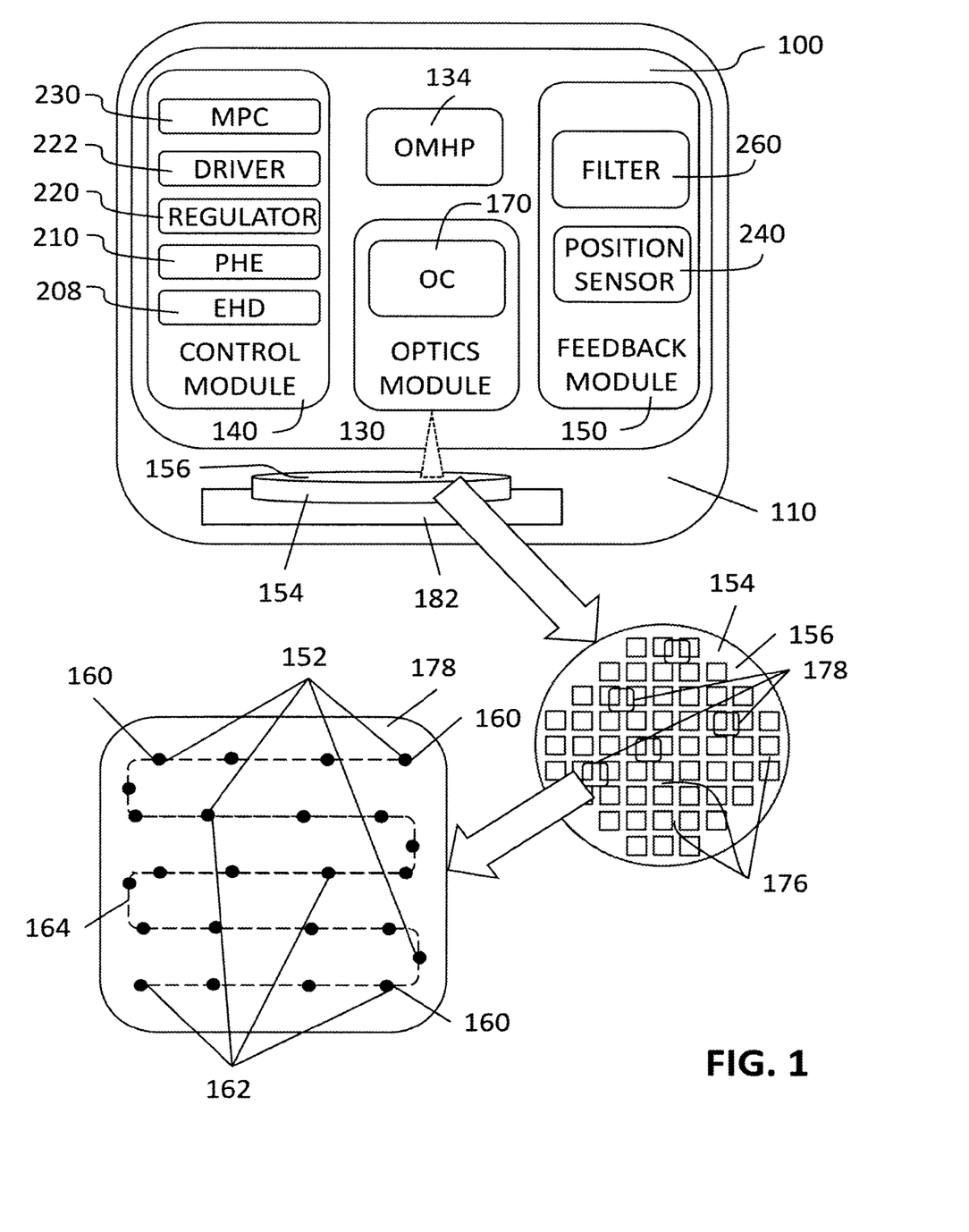
FIG. 1 is a simplified schematic illustration of a metrology tool including an adaptive focusing system, in accordance with a preferred embodiment of the present invention.
Figure 2:
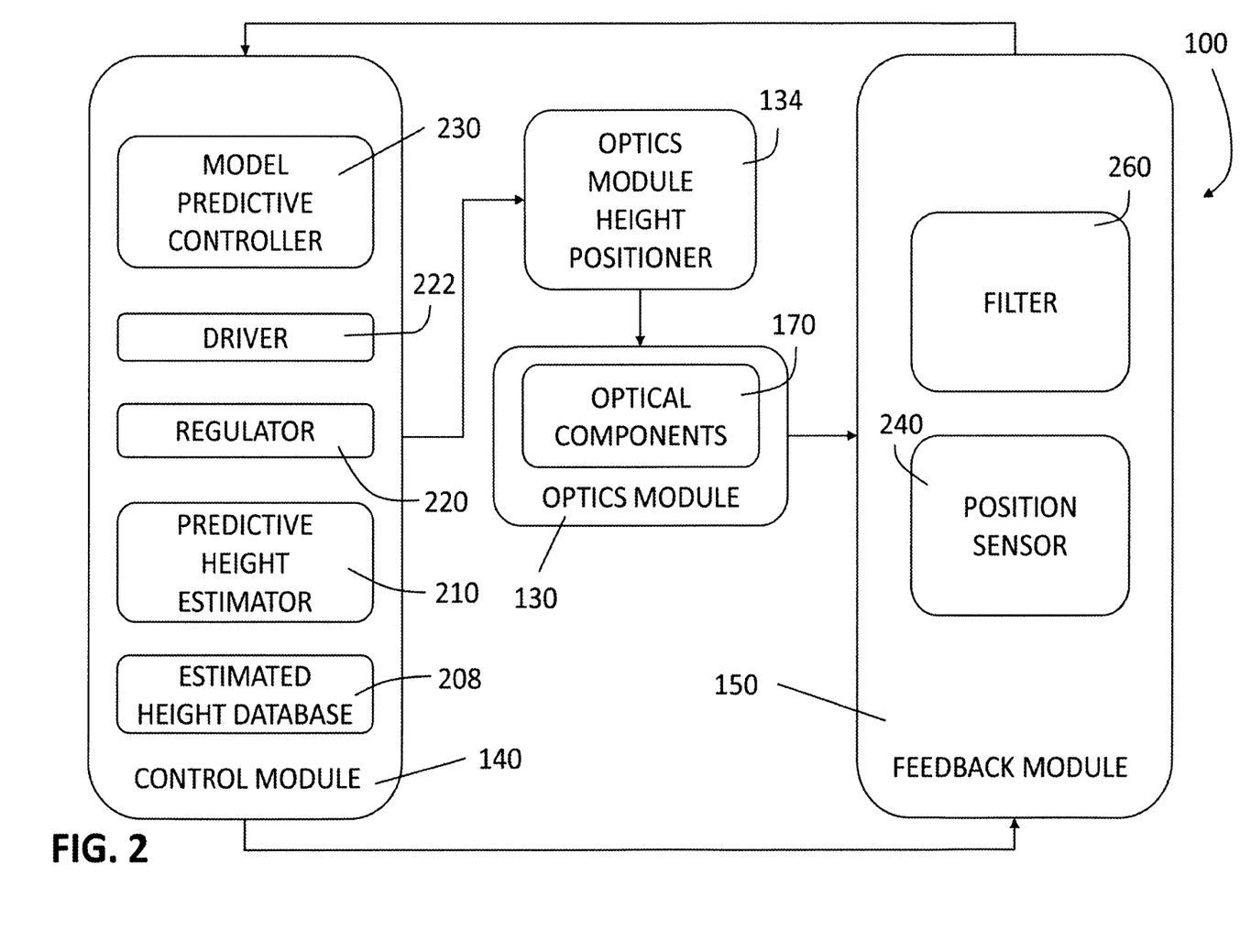
FIG. 2 is a simplified schematic diagram of the adaptive focusing system of FIG. 1.

Reference is now made to FIGS. 1 and 2, which are simplified schematic illustrations of an adaptive focusing system 100 forming part of a metrology tool 110. As seen in FIG. 1, adaptive focusing system 100 includes an optics module 130, an optics module height positioner (OMHP) 134, a control module 140 and a feedback module 150. It is appreciated that FIGS. 1 and 2 are not drawn to scale. It is further appreciated that communication flows between optics module 130, OMI-IP 134, control module 140 and feedback module 150 are illustrated by arrows in FIG. 2.

Preferably, metrology tool 110 is a scanning metrology tool. Metrology tool 110 is operative to measure a plurality of measurement sites 152 on a sample 154, such as a semiconductor device wafer, and optics module 130 and sample 154 are preferably movable relative to each other in order to facilitate the measurement of sample 154 at different measurement sites 152. Sample 154 includes a top surface 156.

Optics module 130 is preferably operative to assume different operative orientations, particularly different heights, relative to sample 154, for measuring each of one or more measurement sites 152. Additionally, optics module 130 is operative to assume different operative orientations, particularly different heights, relative to sample 154, as it traverses individual sites 160 of a plurality of sites 162, plurality of sites 162 being located along a path 164 which is defined by the relative movement between optics module 130 and sample 154. Typically, path 164 lies along top surface 156 of sample 154 and is a path that is traversed by optics module 130 between a measurement of a first measurement site 152 and a second measurement site 152. It is appreciated that any one or more of sites 160 may be selected as measurement sites 152.

It is a particular feature of the present invention that adaptive focusing system 100 is able to achieve a greater focusing precision in less time using less power than can be achieved using a conventional focusing system. Preferably, a difference between an actual optics module height and a desired optics module height output at a site 160 on sample 154 is preferably less than 50 nm, more preferably less than 40 nm, more preferably less than 30 nm, even more preferably less than 25 nm and most preferably less than 20 nm. Additionally, optics module 130 is preferably able to move between a first focused operative orientation at a first measurement site 152 and a second focused operative orientation at a second measurement site 152 in a time that is preferably less than 1 s, more preferably less than 500 ms, more preferably less than 100 ms, more preferably less than 50 ms, more preferably less than 20 ms, more preferably less than 10 ms, more preferably less than 5 ms, even more preferably less than 2 ms and most preferably less than 1 ms.

Metrology tool 110 may be embodied as any suitable metrology tool including, inter alia, a misregistration metrology tool, such as an imaging misregistration metrology tool, a scatterometry-based misregistration metrology tool or an electron beam misregistration metrology tool, a critical dimension and shape metrology tool, a thin film metrology tool and a defect inspection metrology tool.

Examples of such suitable metrology tools include, inter alia, an Archer™ 750, an ATL100™, an eDR7380™, a SpectraShape™ 11k, a SpectraFilm™ F1 and a Candela®

8420, all of which are commercially available from KLA Corporation of Milpitas, Calif., USA.

In an embodiment wherein metrology tool 110 is a misregistration metrology tool, adaptive focusing system 100 and metrology tool 110 are preferably used to measure misregistration between layers of a wafer on which semiconductor devices are formed, and are used in part of a manufacturing process for semiconductor devices. The misregistration measured by adaptive focusing system 100 and metrology tool 110 is preferably used to adjust fabrication processes, such as lithography, during the manufacture of the semiconductor devices to ameliorate misregistration between various layers of the semiconductor devices being fabricated.

Similarly, in an embodiment wherein metrology tool 110 is one of a critical dimension and shape metrology tool, a thin film metrology tool and a defect inspection metrology tool, adaptive focusing system 100 and metrology tool 110 are preferably used to measure a wafer on which semiconductor devices are formed, and are used in part of a manufacturing process for semiconductor devices. The outputs from such an adaptive focusing system 100 and metrology tool 110 are preferably used to adjust fabrication processes, such as lithography, during the manufacture of the semiconductor devices to improve a quality of the semiconductor devices being fabricated.

Preferably, optics module 130 includes at least one optical component (OC) 170, such as, inter alia, one or more lenses or mirrors. OMHP 134 is preferably operative to adjust a position of optics module 130 and may be embodied as any suitable OMHP including, inter alia, a piezoelectric actuator and a non-commutated DC linear actuator (voice coil actuator). An example of a suitable OMHP 134 is, inter alia, an LFA-2010, commercially available from Equipment Solutions Inc. of Forestville, Calif., USA. In a preferred embodiment of the present invention, OMHP 134 draws an average power of preferably less than 1 W, even more preferably less than 0.5 W, and most preferably less than 0.2 W, and OMHP 134 draws a maximum power of preferably less than 5 W, more preferably less than 3 W, even more preferably of less than 2.5 W and most preferably of less than 2 W.

In a preferred embodiment of the present invention, sample 154 measured by metrology tool 110 is embodied as a semiconductor device wafer. Particularly when sample 154 is embodied as a semiconductor wafer, sample 154 typically includes a plurality of scribe lines 176. Preferably, metrology tool 110 measures multiple fields 178 on sample 154, each field 178 being a measurement area within which are measurement sites 152. In a typical embodiment of the present invention, at least some of fields 178 on sample 154 are intended to be identical to others of fields 178 on sample 154.

Thus, measurement sites 152 located in a first field 178 on sample 154 may be intended to be identical to measurement sites 152 located in a second field 178 on sample 154. Similarly, in a preferred embodiment of the present invention, corresponding measurement sites 152 in different ones of scribe lines 176 are intended to be identical to one another.

Similarly, in a preferred embodiment of the present invention, metrology tool 110 may be operative to measure multiple ones of sample 154, each of which are intended to be identical to one another. Thus, corresponding measurement sites 152 in different ones of sample 154 may be intended to be identical to one another.

It is of particular significance in the present invention that each site 160 on sample 154 that is intended to be identical to at least one additional site 160 has a height that is intended to be identical to a height of the at least one additional site 160.

Preferably, metrology tool 110 includes a chuck 182. Chuck 182 is operative to support sample 154, such as a semiconductor device wafer, being measured by metrology tool 110. Chuck 182 is preferably additionally operative to flatten sample 154 for measurement by metrology tool 110. Chuck 182 may be any suitable chuck, including, inter alia, a chuck such as is described in PCT Application No. PCT/US2019/023918. As is known in the art, while typically, a top surface of chuck 182 is preferably generally planar, deviations of the top surface of the chuck from an ideal plane are described by a chuck signature. It is appreciated that the chuck signature of chuck 182 may affect a height of sample 154 supported by chuck 182 during measurement.

Control module 140 preferably includes an estimated height database (EHD) 208, a predictive height estimator (PHE) 210, a regulator 220, a driver 222 and a model predictive controller (MPC) 230. Driver 222 preferably provides a sequence of control outputs to OMHP 134.

Feedback module 150 preferably includes a position sensor 240. Position sensor 240 preferably generates a position output indicating a height of optics module 130. Position sensor 240 may be embodied as, inter alia, a mechanical position sensor, an optical position sensor or an encoder in communication with OMHP 134. A suitable optical position sensor includes, inter alia, the optical position sensor described in U.S. Pat. No. 10,663,281.

In a preferred embodiment of the present invention, feedback module 150 may further include a filter 260, which generates an ameliorated optics module height feedback value; however, in other embodiments of the present invention, filter 260 may be obviated.

Preferably, PHE 210 generates an estimated height value of sample 154 at each site 160 of plurality of sites 162 located along path 164. Preferably, the desired optics module height output is generated by the PHE 210 for each of sites 160 and is at least partially based on the estimated height values of sample 154. It is appreciated that the desired optics module height output for each site is a height position of optics module 130 particularly suited for at least one of measurement of and movement past that site 160. Thus, it is noted that each of the estimated height values generated by PHE 210 are partly a function of a position of sample 154 in metrology tool 110.

Typically, in addition to the estimated height values of sample 154, the desired optics module height outputs generated by PHE 210 are also based on focusing rules. The focusing rules indicate a relationship between the estimated height value of measurement site 152 on sample 154 and a desired focal position of optics module 130. In one embodiment of the present invention, the focusing rules are determined empirically for sample 154.

In a preferred embodiment of the present invention, estimated height values of sample 154 at sites 160 of plurality of sites 162 are stored in EHD 208. Preferably, database entries in EHD 208 are generated by PHE 210. It is appreciated that PHE 210 is preferably operative to access EHD 208, thereby receiving estimated height values for sample 154 at sites 160. PHE 210 is preferably further operative to modify entries EHD 208, by updating estimated height, values for sample 154 at sites 160.

In a preferred embodiment of the present invention, PHE 210 updates EHD 208 during the measuring of sample 154 by metrology tool 110. PHE 210 preferably provides updated estimated height values of sample 154 at sites 160 during at least one of a measurement of a particular measurement site 152 and a movement of optics module 130 relative to sample 154 along path 164. It is appreciated that the movement of optics module 130 relative to sample 154 along path 164 may be achieved either by movement of optics module 130 or by movement of chuck 182, and thus of sample 154. Similarly, the movement of optics module 130 relative to sample 154 along path. 164 may be achieved by movement both of optics module 130 and of chuck 182, and thus of sample 154.

In a preferred embodiment of the present invention, particularly when sample 154 is embodied as a semiconductor device wafer, PHE 210 generates the estimated height value of sample 154, at each site 160 of plurality of sites 162 at least partially based on at least one of the chuck signature of chuck 182, an output from a patterned wafer geometry tool, at least one fabrication surface height output by a fabrication tool which fabricated at least a portion of sample 154, and a height of at least one additional site intended to be identical to the height of the site.

As described hereinabove, chuck 182 has a unique geometry. Thus, the position of sample 154, and thus of the height values of sample 154 at sites 160, are affected by the chuck signature of chuck 182. Additionally, height values of sites 160 on sample 154, particularly when sample 154 is embodied as a semiconductor device wafer, are affected by a bowing of sample 154. One way to quantify the bowing of sample 154 is with the output of the patterned wafer geometry tool. A typical patterned wafer geometry tool suitable for quantifying the bowing of sample 154, particularly when sample 154 is embodied as a semiconductor device wafer, is a PWG™ patterned wafer geometry metrology platform commercially available from KLA Corporation of Milpitas, Calif., USA.

Similarly, data pertaining to height values of sample 154 is typically output by a fabrication tool which fabricated at least a portion of sample 154. For example, particularly when sample 154 is embodied as a semiconductor device wafer, a lithography scanner used to fabricate sample 154 typically outputs a fabrication surface height of sample 154, which provides height values of sample 154 upon completion of a fabrication step performed by the lithography scanner. An immersion scanner useful as the lithography scanner is an NSR-S635E, commercially available from Nikon Corporation of Tokyo, Japan.

Furthermore, PHE 210 is preferably operative to generate the estimated height value at each site 160 of plurality of sites 162 at least partially based on the reported height of the at least one additional site intended to be identical to the height of site 160. Typically, particularly when sample 154 is embodied as a semiconductor device wafer, the at least one additional site is located on at least one of one or more previously measured scribe lines 176 on sample 154, one or more previously measured fields 178 on sample 154, one or more previously measured scribe lines 176 on an additional sample 154 and one or more previously measured fields 178 on an additional sample 154.

In an embodiment of the present invention, the reported height of the at least one additional site is output by filter 260. In an embodiment of the present invention, particularly when sample 154 is embodied as a semiconductor device wafer, the value of the height of the at least one additional site is generated at least partially based on a measurement of sample 154 prior to the formation of a current layer on sample 154. Similarly, the estimated height value for any site 160 may be generated based frilly or partly on a previous measurement of that site 160. For example, in some embodiments of the present invention, one or more measurement sites 152 are measured twice: a first measurement is taken as optics module 130 traverses path 164 in a first direction, and a second measurement is taken as optics module 130 traverses path 164 in a second direction. In such a case, PHE 210 bases the estimated height values for the second measurement of measurement site 152 at least partially on height data collected during the first measurement of measurement site 152.

In one embodiment of the present invention, PHE 210 includes a linear estimation model, such as, inter alia, a minimum mean square estimation (MMSE) model. In another embodiment of the present invention, PHE 210 includes a non-linear estimation model, such as, inter alia, a neural network.

Preferably, the desired optics module height output generated by PHE 210 for each site 160 of plurality of sites 162, together with a known height of optics module 130 are used by regulator 220 to generate a sequence of optics module height control instructions for the plurality of sites 162 along path 164.

It is appreciated that the optics module height control instructions generated by regulator 220 preferably indicate a sequence of control outputs, such as a sequence of current values or voltage values, for driver 222 to provide to OMHP 134, in order to move optics module 130 to the desired optics module height at each site 160 of plurality of sites 162 located along path 164.

It is further appreciated that the known height of optics module 130 indicates a current height of optics module 130. The known height of optics module 130 may be stored or accessed by regulator 220. Typically, the known height of optics module 130 is at least partially based on the position output generated by position sensor 240. In one embodiment of the present invention, the known height of optics module 130 is more specifically based on the ameliorated optics module height feedback value generated by filter 260.

Preferably, regulator 220 calculates a difference between the desired optics module height output generated by PHE 210 and the known height of optics module 130. Thus, the sequence of optics module height control instructions generated by regulator 220 is useful in moving optics module 130 from a current height to the desired optics module height at each site 160 of plurality of sites 162 located along path 164.

In a preferred embodiment of the present invention, regulator 220 is a model-based controller, such as, inter alia, a linear quadratic regulator (LQR) or a linear quadratic gaussian (LQG) regulator.

Regulator 220 preferably uses a set of system equations, the set of system equations being equations of motion and/or equations of state which describe a relationship between at least two of: optics module 130, OMHP 134, position sensor 240, PHE 210, regulator 220, driver 222 and filter 260.

Preferably, in addition to the known height of optics module 130, the optics module height control instructions generated by regulator 220 are at least partially based on a control effort. The control effort is a required magnitude of the control outputs of driver 222. It is appreciated that the magnitude of the current or voltage that is supplied by the driver 222 to OMHP 134 is directly related to a motion of optics module 130 and OC 170, particularly to an acceleration thereof.

In a preferred embodiment of the present invention, regulator 220 has access to a vector state of optics module 130 and OC 170, including a position, velocity and acceleration thereof. Regulator 220 preferably considers the effect of the control outputs of driver 222 on the vector state of optics module 130, and generates optics module height control instructions that do not result in an undesired vector state of optics module 130. More specifically, in order to generate optics module height control instructions, regulator 220 preferably minimizes a loss function for the desired optics module height output generated by PHE 210 and the required magnitude of the control outputs of driver 222.

Preferably, MPC 230 generates system amelioration values by monitoring differences between a reported height of optics module 130 and an MPC-expected height of optics module 130. Preferably, the reported height of optics module 130 is at least partially based on the position output generated by position sensor 240. In one embodiment of the present invention, the reported height of optics module 130 is more specifically based on the ameliorated optics module height feedback value generated by filter 260.

In one embodiment of the present invention, the MPC-expected height of optics module 130 is at least partially based on the optics module height control instructions of regulator 220. Additionally or alternatively, the MPC-expected height of optics module 130 is at least partially based on the control outputs of driver 222.

The system amelioration values generated by MPC 230 are preferably parameters of a set of system equations, the set of system equations being equations of motion and/or equations of state which describe a relationship between at least two of optics module 130, OMHP 134, position sensor 240, PHE 210, regulator 220, driver 222 and filter 260.

For example, the parameters may be embodied as, inter alia, a mass, a damping constant, a spring constant, a power coefficient, an electro-magnetic force, a resistivity, an inductance and a capacitance. By way of example, the mass, damping constant and spring constant system amelioration values may be respective ameliorated mass, damping constant and spring constant values for OMHP 134. Similarly, the resistivity, inductance and capacitance system amelioration values may be respective ameliorated resistivity, inductance and capacitance values for either or both of driver 222 and OMHP 134.

Preferably, MPC 230 communicates the system amelioration values to at least one of PHE 210, regulator 220 and filter 260, which then use the system amelioration values in system equations used thereby.

Preferably, filter 260 is a model-based filter, such as a Kalman filter, which compares the position output generated by position sensor 240 and a filter-expected height of optics module 130, and generates the ameliorated optics module height feedback value. Thus, the ameliorated optics module height feedback value generated by filter 260 is preferably a function of at least the position output generated by position sensor 240 and a filter-expected height of optics module 130. Preferably, the filter-expected height of optics module 130 is a function of at least one of the optics module height control instructions generated by regulator 220 and the control outputs provided by driver 222 to OMHP 134.

Filter 260 preferably references a set of system equations, the set of system equations being equations of motion and/or equations of state which describe a relationship between at least two of: optics module 130, OMHP 134, position sensor 240, PHE 210, regulator 220, driver 222 and filter 260.

Preferably, when filter 260 compares multiple values that represent a single state of a single system component, such as the position output generated by position sensor 240 and the filter-expected height of optics module 130, filter 260 further considers which of the multiple values has a higher expected accuracy, and assigns a higher relative weight thereto.

Filter 260 is preferably operative to communicate the ameliorated optics module height feedback value to at least one of PHE 210, regulator 220 and MPC 230, which then preferably use the ameliorated optics module height feedback value from filter 260 as the height of optics module 130.

It is appreciated that although in the illustrated example shown in FIG. 1 and described hereinabove, sample 154 is a semiconductor device wafer, in an additional embodiment of the present invention, metrology tool 110 measures a sample other than a semiconductor device wafer. For example, metrology tool 110 may measure, inter alia, a fully or partially formed liquid-crystal display (LCD), a mirror and a lens.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. An adaptive focusing system for a scanning metrology tool, the adaptive focusing system comprising:
   an optics module comprising at least one optical component;
   an optics module height positioner (OMHP);
   a position sensor operative to generate a position output indicating a height of said optics module;
   a predictive height estimator (PHE) operative to:
      generate an estimated height value of a sample at each site of a plurality of sites, said plurality of sites being located along a path defined by a movement of said optics module relative to said sample; and
      generate a desired optics module height output for each of said sites, said desired optics module height output being based at least partially on said estimated height value at said site;
   a regulator operative to generate, at least partially based on said desired optics module height output and a known height of said optics module, a sequence of optics module height control instructions for said plurality of sites;
   a driver operative to provide a sequence of control outputs to said OMHP, said sequence of control outputs being based on said sequence of optics module height control instructions; and
   a model predictive controller (MPC) operative to monitor differences between a reported height of said optics module, said reported height being at least partially based on said position output generated by said position sensor, and an MPC-expected height of said optics module, said MPC-expected height of said optics module being at least partially based on said optics module height control instructions, thereby to generate system amelioration values.

2. The adaptive focusing system according to claim 1, further comprising a filter operative to generate an ameliorated optics module height feedback value.

3. The adaptive focusing system according to claim 2, wherein said ameliorated optics module height feedback value is a function of at least said position output of said position sensor and a filter-expected height of said optics module.

4. The adaptive focusing system according to claim 3, wherein said filter-expected height of said optics module is a function of at least one of said optics module height control instructions of said regulator or said control outputs of said driver.

5. The adaptive focusing system according to claim 2, wherein said reported height of said optics module comprises said ameliorated optics module height feedback value generated by said filter.

6. The adaptive focusing system according to claim 2, wherein said filter is operative to communicate said ameliorated optics module height feedback value feedback to at least one of:
   said PHE;
   said regulator; or
   said MPC.

7. The adaptive focusing system according to claim 2, wherein said system amelioration values comprise parameters of a set of equations, said set of equations describing a relationship between at least two of:
   said optics module;
   said OMHP;
   said position sensor;
   said PHE;
   said regulator;
   said driver; or
   said filter.

8. The adaptive focusing system according to claim 2, wherein said MPC is operative to communicate said system amelioration values to at least one of:
   said PHE;
   said regulator; or
   said filter.

9. The adaptive focusing system according to claim 1, further comprising an estimated height database (EHD), and wherein said PHE is operative to access and modify said EHD.

10. The adaptive focusing system according to claim 1, wherein said PHE updates said estimated height values during at least one of:
    a measurement of said measurement site; or
    a movement of said optics module relative to said sample.

11. The adaptive focusing system according to claim 1, wherein said estimated height value comprises a surface height of a semiconductor device wafer at said site, and wherein said PHE generates said estimated height value at least partially based on at least one of:
    a chuck signature;
    an output from a patterned wafer geometry tool;
    at least one fabrication surface height output by a fabrication tool which fabricated at least a portion of said wafer; or
    a reported height of at least one additional site intended to be identical to a height of said site.

12. The adaptive focusing system according to claim 11, wherein said estimated height value is at least partially based on at least said reported height of at least one additional site, wherein said additional site comprises at least one site located on at least one of:
    one or more previously measured scribe lines on said wafer;
    one or more previously measured fields on said wafer;
    one or more previously measured scribe lines on an additional wafer; or
    one or more previously measured fields on an additional wafer.

13. The adaptive focusing system according to claim 11, wherein said estimated height value is at least partially based on at least said reported height of at least one additional site, wherein a value of said height of said at least one additional site is generated at least partially based on a measurement of said wafer prior to the formation of a current layer on said wafer.

14. The adaptive focusing system according to claim 1, wherein said PHE comprises a linear estimation model, and wherein said linear estimation model comprises a minimum mean square estimation (MMSE) model.

15. The adaptive focusing system according to claim 1, wherein said PHE comprises a non-linear estimation model, and wherein said non-linear estimation model comprises a neural network.

16. The adaptive focusing system according to claim 1, wherein said optics module height control instructions are further based on a required magnitude of said control outputs.

17. The adaptive focusing system according to claim 1, wherein said regulator comprises one of:
    a linear quadratic regulator (LQR); or
    a linear quadratic gaussian (LQG) regulator.

18. The adaptive focusing system according to claim 1, wherein said system amelioration values comprise at least one of:
    a mass;
    a damping constant;
    a spring constant;
    a power coefficient;
    an electro-magnetic force;
    a resistivity;
    an inductance; or
    a capacitance.

19. The adaptive focusing system according to claim 1, wherein said MPC-expected height is at least partially based on said control outputs.

20. The adaptive focusing system according to claim 1, wherein a difference between an actual optics module height at a site and said desired optics module height output at said site is less than 25 nm.

21. The adaptive focusing system according to claim 1, wherein:
    said optics module has a first focused operative orientation at a first measurement site;
    said optics module has a second focused operative orientation at a second measurement site; and
    said optics module is operative to move between said first focused operative orientation and said second focused operative orientation in a time of less than 2 milliseconds.

22. The adaptive focusing system according to claim 1, wherein said OMHP draws an average power of less than 0.1 W and a maximum power of less than 2 W.

23. A scanning metrology system comprising:
    a scanning metrology tool comprising an adaptive focusing system, the adaptive focusing system comprising:
    an optics module comprising at least one optical component;
    an optics module height positioner (OMHP);
    a position sensor operative to generate a position output indicating a height of said optics module;
    a predictive height estimator (PHE) operative to:
    generate an estimated height value of a sample at each site of a plurality of sites, said plurality of sites being located along a path defined by a movement of said optics module relative to said sample; and generate a desired optics module height output for each of said sites, said desired optics module height output being based at least partially on said estimated height value at said site;

a regulator operative to generate, at least partially based on said desired optics module height output and a known height of said optics module, a sequence of optics module height control instructions for said plurality of sites;

a driver operative to provide a sequence of control outputs to said OMHP, said sequence of control outputs being based on said sequence of optics module height control instructions; and a model predictive controller (MPC) operative to monitor differences between a reported height of said optics module, said reported height being at least partially based on said position output generated by said position sensor, and an MPC-expected height of said optics module, said MPC-expected height of said optics module being at least partially based on said optics module height control instructions, thereby to generate system amelioration values.

24. The scanning metrology system according to claim 23, wherein said scanning metrology tool comprises one of:
a misregistration metrology tool;
a critical dimension and shape metrology tool;
a thin film metrology tool; or
a defect inspection metrology tool.

* * * * *